(12) United States Patent  
Wang et al.

(10) Patent No.: US 8,067,763 B2  
(45) Date of Patent: Nov. 29, 2011

(54) QUANTUM DOT SOLAR CELL WITH CONJUGATED BRIDGE MOLECULE

(75) Inventors: Wei Jun Wang, Shanghai (CN); Zhi Zheng, Shanghai (CN); Tao Pan, Shanghai (CN); Yue Liu, Plymouth, MN (US); Linan Zhao, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 352 days.

(21) Appl. No.: 12/336,917

(22) Filed: Dec. 17, 2008

(65) Prior Publication Data

US 2009/0159120 A1 Jun. 25, 2009

Related U.S. Application Data

(60) Provisional application No. 61/014,899, filed on Dec. 19, 2007.

(51) Int. Cl.
*H01L 51/44* (2006.01)

(52) U.S. Cl. .............. 257/40; 136/263; 257/E51.015

(58) Field of Classification Search .......... 136/252, 136/263; 257/40, E51.001–E51.052; 438/82, 438/99
See application file for complete search history.

(56) References Cited

U.S. PATENT DOCUMENTS

| | | | |
|---|---|---|---|
| 4,927,721 A | 5/1990 | Gratzel et al. |
| 5,677,545 A | 10/1997 | Shi et al. |
| 6,566,595 B2 | 5/2003 | Suzuki |
| 6,919,119 B2 | 7/2005 | Kalkan et al. |
| 7,032,209 B2 | 4/2006 | Kobayashi |
| 7,042,029 B2 | 5/2006 | Graetzel et al. |
| 7,202,412 B2 | 4/2007 | Yamanaka et al. |
| 7,202,943 B2 | 4/2007 | Chang et al. |
| 7,268,363 B2 | 9/2007 | Lenhard et al. |
| 7,462,774 B2 | 12/2008 | Roscheisen et al. |
| 7,563,507 B2 | 7/2009 | Emrick et al. |
| 7,655,860 B2 | 2/2010 | Parsons |
| 2005/0028862 A1 | 2/2005 | Miteva et al. |
| 2006/0021647 A1 | 2/2006 | Gui et al. |

(Continued)

FOREIGN PATENT DOCUMENTS

EP   1473745   11/2004

(Continued)

OTHER PUBLICATIONS

Gebeyehu, D., et al. "Hybrid Solar Cells Based on Dye-Sensitized Nanoporous TiO2 Electrodes and Conjugated Polymers as Hole Transport Materials." Synth. Met., vol. 125 (2002): pp. 279-287.*

Banerjee, S. and Wong, S.S. "Synthesis and Characterization of Carbon Nanotube-Nanocrystal Heterostructures." Nanolett., vol. 2 (2002): pp. 195-200.*

(Continued)

*Primary Examiner* — Matthew W Such

(74) *Attorney, Agent, or Firm* — Seager, Tufte & Wickhem LLC

(57) ABSTRACT

A solar cell including a quantum dot, an electron conductor, and a conjugated bridge molecule disposed between the quantum dot and the electron conductor. The conjugated bridge molecule may include a quantum dot anchor that bonds to the quantum dot and an electron conductor anchor that bonds to the electron conductor. In some instances, the quantum dot anchor and/or the electron conductor anchor may independently include two anchoring moieties that can form ring structures with the quantum dot and/or the electron conductor. The solar cell may further include a hole conductor that is configured to reduce the quantum dot once the quantum dot absorbs a photon and ejects an electron through the conjugated bridge molecule and into the electron conductor.

15 Claims, 6 Drawing Sheets

U.S. PATENT DOCUMENTS

| | | | |
|---|---|---|---|
| 2006/0169971 | A1 | 8/2006 | Cho et al. |
| 2006/0263908 | A1* | 11/2006 | Hirai .......................... 436/526 |
| 2007/0025139 | A1 | 2/2007 | Parsons |
| 2007/0028959 | A1 | 2/2007 | Lee et al. |
| 2007/0062576 | A1 | 3/2007 | Duerr et al. |
| 2007/0119048 | A1 | 5/2007 | Li et al. |
| 2007/0120177 | A1 | 5/2007 | McGregor et al. |
| 2007/0122927 | A1 | 5/2007 | Li et al. |
| 2007/0123690 | A1 | 5/2007 | Parham et al. |
| 2007/0243718 | A1 | 10/2007 | Shiratori et al. |
| 2008/0110494 | A1 | 5/2008 | Reddy |
| 2008/0264479 | A1 | 10/2008 | Harris et al. |
| 2009/0114273 | A1* | 5/2009 | Kamat .......................... 136/252 |
| 2009/0159124 | A1 | 6/2009 | Mihaila et al. |
| 2009/0159131 | A1 | 6/2009 | Zheng et al. |
| 2009/0159999 | A1 | 6/2009 | Zheng et al. |
| 2009/0211634 | A1 | 8/2009 | Serban et al. |
| 2009/0260682 | A1 | 10/2009 | Serban et al. |
| 2009/0260683 | A1 | 10/2009 | Serban et al. |
| 2009/0283142 | A1 | 11/2009 | Serban et al. |
| 2010/0006148 | A1 | 1/2010 | Zheng et al. |
| 2010/0012168 | A1 | 1/2010 | Mihaila et al. |
| 2010/0012191 | A1 | 1/2010 | Serban et al. |
| 2010/0043874 | A1 | 2/2010 | Liu |
| 2010/0116326 | A1 | 5/2010 | Gur et al. |
| 2010/0193025 | A1 | 8/2010 | Serban et al. |
| 2010/0193026 | A1 | 8/2010 | Serban et al. |
| 2010/0326499 | A1 | 12/2010 | Liu |

FOREIGN PATENT DOCUMENTS

| | | |
|---|---|---|
| EP | 1689018 | 8/2006 |
| EP | 1936644 | 6/2008 |
| JP | 2008177099 | 7/2008 |
| WO | WO 2004/017345 | 2/2004 |
| WO | WO 2006/099386 | 9/2006 |
| WO | WO 2006/119305 | 11/2006 |
| WO | WO 2007/098378 | 8/2007 |
| WO | WO 2007/100600 | 9/2007 |

OTHER PUBLICATIONS

Ma, Y., et al. "A Sensitive Method for the Detection of Catecholamine Based on Fluorescence Quenching of CdSe Nanocrystals." TALANTA, vol. 67 (2005): pp. 979-983.*

Wu, J.-P., et al. "Phosphate-Modified TiO2 Nanoparticles for Selective Detection of Dopamine, Levodopa, Adrenaline, and Catechol Based on Fluorescence Quenching." LANGMUIR, vol. 23 (2007): pp. 7880-7885.*

Leschkies, K.S., et al. "Photosensitization of ZnO Nanowires with CdSe Quantum Dots for Photovoltaic Devices." Nanolett., vol. 7 (2007): pp. 1793-1798.*

Huber, R., et al. "The Role of Surface States in the Ultrafast Photoinduced Electron Transfer from Sensitizing Dye Molecules to Semiconductor Colloids." J. Phys. Chem. B, vol. 104 (2000): pp. 8995-9003.*

Clarke, S.J., et al. "Photophysics of Dopamine-Modified Quantum Dots and Effects on Biological Systems." Nat. Mater., vol. 5 (2006): pp. 409-417.*

Afzal, "Studies of Cephradine Metal Interactions," 342 pages, Oct. 1998.

Anacona et al., "Synthesis and Antibacterial Activity of Cefotaxime Metal Complexes," Journal of the Chilean Chemical Society, vol. 50, No. 2, 7 pages, Jun. 2005.

Anacona et al., "Synthesis and Antibacterial Activity of Cefoxitin Metal Complexes," Transition Metal Chemistry, vol. 30, pp. 605-609, 2005.

Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.

Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.

Diol Et al., "Electron Transfer Dynamics at GaAs Surface Quantum Wells," Journal of Physical Chemistry B, vol. 102, pp. 6193-6201, 1998.

El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.

Enescu, Medicamente, pp. 292-293, 2005.

Enright et al., "Spectroscopic Determination of Electron and Hole Effective Masses in a Nanocrystalline Semiconductor Film," Journal of Physical Chemistry vol. 100, No. 3, pp. 1027-1035, 1996.

Galoppini, "Linkers for Anchoring Sesitizers to Semiconductor Nanoparticles," Coordination Chemistry Reviews vol. 248, pp. 1283-1297, 2004.

Gautam et al., "Soft Chemical Routes to Semiconductor Nanostructures," Pramana Journal of Physics, vol. 65, No. 4, pp. 549-564, Oct. 2005.

Gregg, "Excitonic Solar Cells," Journal of Physical Chemistry B., vol. 107, pp. 4688-4698, No. 20, May 1, 2003.

Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.

http://en.wikipedia.org/wiki/Quantum_dot_solar_cell, "Nanocrystal Solar Cell," 1 page, printed Oct. 17, 2007.

http://findarticles.com/articles/mi_qa3776/is_200605ai_n17176721/print, "Ultradense GaN Nanopillar and Nanopore Arrays by Self-Assembly Nanopatterning," 4 pages, May 5, 2008.

http://www.evidenttech.com, Evident Technologies Webpages, 11 pages, printed Oct. 17, 2007.

http://www.i-sis.org.uk/QDAUESC.php, "Quantum Dots and Ultra-Efficient Solar Cells?" ISIS Press Release, Jan. 19, 2006.

Hwang et al., "A Highly Efficient Organic Sensitizer for Dye-Sensitized Solar Cells," Chemical Communications, 5 pages, printed Sep. 27, 2007.

ISBN No. 7-04-009141-0, 8 pages, 2001, 2003.

ISBN No. 978-7-03-015873-4, 8 pages, 2005.

Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.

Kim et al., "Enhanced Photocatalytic Activity in Composites of $TiO_2$ Nanotubes and Cds Nanoparticles," Chem. Commun., pp. 5024-5026, 2006.

Klimov, "Spectral and Dynamical Properties of Multiexcitons in Semiconductor Nanocrystals," ANRV, vol. 308-PC58-24, pp. 635-673, Dec. 2, 2006.

Kouklin et al., "Ultradense GaN Nanopillar and Nanopore Arrays by Self-Assembly and Nanopatterning," Journal of Electronic Materials, vol. 35, No. 5, pp. 1133-1137, May 2006.

Kuzyk, "Erratum: Physical Limits on Electronic Nonlinear Molecular Susceptibilities," Physical Review Letters, vol. 90, No. 3, 1 page, Jan. 2003.

Kuzyk, "Fundamental Limits on Third-Order Molecular Susceptibilities," Optics Letters, vol. 25, No. 16, pp. 1183-1185, Aug. 15, 2000.

Kuzyk, "Physical Limits on Electronic Nonlinear Molecular Susceptibilities," Physical Review Letters, vol. 85, No. 6, pp. 1218-1221, Aug. 7, 2000.

Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.

Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.

Li et al., "Band-Structure-Corrected Local Density Approximation Study of Semiconductor Quantum Dots and Wires," Physical Review B., vol. 72, 15 pages, 2005.

Li et al., "Conducting Polythiophenes with a Broad Spectrum of Reactive Groups," Journal of Polymer Science A, Polymer Chemistry, vol. 43, pp. 4547-4558, 2005.

Li et al., "Review of Recent Progress in Solid-State Dye-Sensitized Solar Cells," Solar Energy Materials and Solar Cells, vol. 90, pp. 549-573, 2006.

Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.

Marcus et al, "Electron Transfers in Chemistry and Biology," Biochimica et Biophysica Acta, vol. 811, pp. 265-322, 1985.

Marcus et al., "Electron Transfer Reactions in Chemistry, Theory and Experiment," Reviews of Modern Physics, vol. 65, No. 3, pp. 599-610, Jul. 1993.

Marcus, "Electrostatic Free Energy and Other Properties of States Having Nonequilibrium Polarization. I," The Journal of Chemical Physics, vol. 24, No. 5, 11 pages, May 1956.

Marcus, "On the Theory of Oxidation-Reduction Reactions Involving Electron Transfer. I," The Journal of Chemical Physics, vol. 24, No. 5, 13 pages, May 1956.

Meier et al., "Fast Electron Transfer Across Semiconductor-Molecule Interfaces: GaAs/Co(Cp)$_2$," Journal of Physical Chemistry B., vol. 103, pp. 2122-2141, 1999.

Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.

Morrison et al., Organic Chemistry, Sixth Edition, Chapter 6, pp. 240-242, 1992.

Neale et al., "Effect of a Coadsorbent on the Performance of Dye-Sensitized TiO$_2$ Solar Cells: Shielding Versus Band-Edge Movement," Journal of Physical Chemistry B., vol. 109, No. 49, pp. 23183-23189, 2005.

Nenitescu, Chimie Organica, vol. I, p. 522, 1980.

Nenitescu, Chimie Organica, vol. II, p. 581, 1980.

Nilsing et al., "Phosphonic Acid Adsorption at the TiO$_2$ Anatase (101) Surface Investigated by Periodic Hybrid HF-DFT Computations," Surface Science, vol. 582, pp. 49-60, 2005.

Nozick et al., "Quantum Dot Solar Cells," Physica E, vol. 14, pp. 115-120, 2002.

O'Reagan et al., "A Low-Cost, High Efficiency Solar Cell Based on Dye-Sensitized Colloidal TiO$_2$ Films," Nature, vol. 353, pp. 737-740, Oct. 24, 1991.

Oyaizu et al., "Linear Ladder-Type Conjugated Polymers Composed of Fused Thiophene Ring Systems," Macromolecules, vol. 37, No. 4, pp. 1257-1270, 2004.

Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.

Perez-Moreno et al., "Modulated Conjugation as a Means for Attaining a Record High Intrinsic Hyperpolarizability," Optics Letters, vol. 32, No. 1, pp. 59-61, Jan. 1, 2007.

Pomerantz et al., "Synthesis and Properties of Poly [3-(w-bromoalkyl)thiophene]," Synthetic Metals, vol. 101, 1 page, 1999.

Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.

Qian et al., "Gallium Nitride-Based Nanowire Radial Heterostructures for Nanophotonics," NanoLetters, vol. 4, No. 10, pp. 1975-1979, 2004.

Qiu et al., "Fabrication of TiO$_2$ Nanotube Film by Well-Aligned ZnO Nanorod Array Film and Sol-Gel Process," Thin Solid Films, vol. 515, pp. 2897-2902, 2007.

Robel et al., "Quantum Dot Solar Cells, Harvesting Light Energy with CdSe Nanocrystals Molecularly Linked to Mesoscopic TiO$_2$ Films," Journal of the American Chemical Society, vol. 128, No. 7, pp. 2385-2393, 2006.

Robel et al., "Size-Dependent Electron Injection from Excited CdSeQuantum Dots into TiO$_2$ Nanoparticles," JACS Communications, 2 pages, Mar. 21, 2007.

Wang et al. "Enhance the Performance of Dye-Sensitized Solar Cells by Co-grafting Amphiphilic Sensitizer and Hexadecylmalonic Acid on TiO$_2$ Nanocrystals," Journal of Physical Chemistry B., vol. 107, No. 51, pp. 14336-14341, 2003.

Wu et al., "Superior Radiation Resistance of In$_{1-x}$Ga$_x$N Alloys: Full-Solar-Spectrum Photovoltaic Material System," Journal of Applied Physics, vol. 24, No. 10, pp. 6477-6482, Nov. 15, 2003.

Xu et al., "New Triphenylamine-Based Dyes for Dye-Sensitized Solar Cells," Journal of Physical Chemistry C, vol. 112, No. 3, pp. 874-880, 2008.

Yum et al., "Efficient Co-Sensitization of Nanocrystalline TiO$_2$ Films by Organic Sensitizers," Chemical Communications, 7 pages, printed Sep. 27, 2007.

Dennler et al., "Polymer-Fullerene Bulk-Heterojunction Solar Cells," Advanced Materials, vol. 21, pp. 1323-1338, 2009.

Kline et al., "Highly Oriented Crystals at the Buried Interface in Polythiophene Thin-Film Transistors," Nature Materials, vol. 5, pp. 222-228, Mar. 2006.

Peet et al., "Efficiency Enhancement in Low-bandgap Polymer Solar Cells by Processing with Alkane Dithiols," Nature Materials, Advance Online Publication, pp. 1-4, May 27, 2007.

Diguna et al., "High Efficiency of CdSe Quantum-Dot-Sensitized TiO2 Inverse Opal Solar Cells," Applied Physics Letters, vol. 91, No. 023116, 3 pages, 2007.

Chang et al., "Chemical Bath Deposition of CdS Quantum Dots Onto Mesoscopic TiO$_2$ Films for Application in Quantum-Dot-Sensitized Solar Cells," Applied Physics Letters, vol. 91, 3 pages, 2007.

U.S. Appl. No. 12/542,474, filed Aug. 17, 2009.
U.S. Appl. No. 12/433,560, filed Apr. 30, 2009.
U.S. Appl. No. 12/423,581, filed Apr. 14, 2009.
U.S. Appl. No. 12/484,034, filed Jun. 12, 2009.
U.S. Appl. No. 12/468,755, filed May 19, 2009.
U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829, filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.

Hodes, "Chemical Solution Deposition of Semiconductor Films," Marcel Dekker Inc., 381 pages, 2002.

Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.

Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.

Landes et al., "On the Nanoparticle to Molecular Size Transition: Flourescence Quenching Studies," vol. 105, No. 43, pp. 10554-10558, 2001.

Law et al., "ZnO-Al$_2$O$_3$ and ZnO-TiO$_2$ Core-Shell Nanowire Dye-Sensitized Solar Cells," Journal Phys. Chemistry B, vol. 110, No. 45, pp. 22652-22663, 2006.

Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 7 pages, 2008.

Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.

Plass et al., "Quantum Dot Sensitization of Organic-Inorganic Hybrid Solar Cells," Journal Phys. Chemistry B, vol. 106, No. 31, pp. 7578-7580, 2002.

Quintana et al., "Comparison of Dye-Sensitized ZnO and TiO$_2$ Solar Cells: Studies of Charge Transport and Carrier Lifetime," pp. 1035-1041, Journal Phys. Chemistry C, vol. 111, No. 2, pp. 1035-1041, 2007 (published on web Dec. 14, 2006).

Sharma et al., "Photoinduced Charge Transfer Between CdSe Quantum Dots and p-Phenylenediamine," Journal Phys. Chemistry B, vol. 107, No. 37, pp. 10088-10093, 2003.

Snaith et al., "Self-Organization of Nanocrystals in Polymer Brushes. Application in Heterojunction Photovoltaic Diodes," Nano Letters, vol. 5, No. 9, pp. 1653-1657, 2005.

Zhai et al., "A Simple Method to Generate Side-Chain Derivatives of Regioregular Polythiophene Via the GRIM Metathesis and Post-Polymerization Functionalization," Macromolecules, vol. 36, No. 1, pp. 61-64, 2003 (published on web Dec. 14, 2002).

* cited by examiner

QUANTUM DOT SOLAR CELL WITH CONJUGATED BRIDGE MOLECULE

PRIORITY

This application claims priority to provisional application Ser. No. 61/014,899 filed Dec. 19, 2007 entitled "QUANTUM DOT SOLAR CELL WITH CONJUGATED BRIDGE MOLECULE", which is incorporated by reference herein.

TECHNICAL FIELD

The disclosure relates generally to solar cells and more particularly to quantum dot solar cells.

SUMMARY

The disclosure pertains generally to solar cells. In an illustrative but non-limiting example, the disclosure relates to a solar cell that includes a quantum dot, an electron conductor, a conjugated bridge molecule and a hole conductor. The conjugated bridge molecule may be disposed between the quantum dot and the electron conductor, and may include a quantum dot anchor that is bonded to the quantum dot and an electron conductor anchor that is bonded to the electron conductor. The hole conductor may be disposed in contact with the quantum dot.

The above summary is not intended to describe each disclosed embodiment or every implementation of the disclosure. The Figures and Detailed Description which follow more particularly exemplify these embodiments.

BRIEF DESCRIPTION OF THE FIGURES

The following description should be read with reference to the drawings, in which like elements in different drawings are numbered in like fashion. The drawings, which are not necessarily to scale, depict selected embodiments and are not intended to limit the scope of the disclosure. The disclosure may be more completely understood in consideration of the following detailed description of various embodiments in connection with the accompanying drawings, in which.

Figure 1:
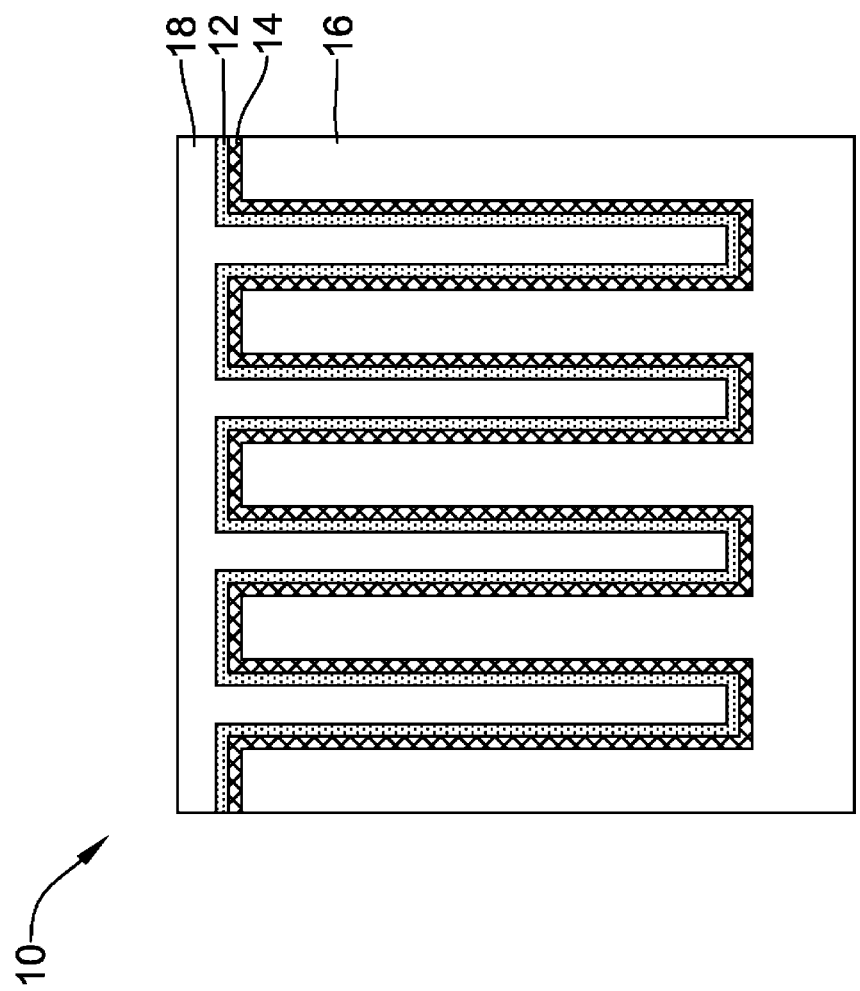
FIG. 1 is a schematic cross-sectional side view of an illustrative but non-limiting example of a solar cell.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

FIG. 1 is a schematic cross-sectional side view of an illustrative solar cell 10. In the illustrative example shown in FIG. 1, there is a three-dimensional intermingling or interpenetration of the layers forming solar cell 10, but this is not required. The illustrative solar cell 10 includes a quantum dot layer 12. Quantum dot layer 12 may schematically represent a single quantum dot. In some cases, quantum dot layer 12 may be considered as representing a large number of individual quantum dots. In the illustrative embodiment of FIG. 1, a bridge layer 14 is provided, and may schematically represent a single rigid bridge molecule, such as those discussed below. In some cases, bridge layer 14 may represent a large number of individual rigid bridge molecules, with at least some of the rigid bridge molecules within bridge layer 14 bonded to corresponding quantum dots within quantum dot layer 12. The illustrative solar cell 10 also includes an electron conductor layer 16. In some cases, electron conductor layer 16 may be an n-type conductor as discussed below.

The illustrative solar cell 10 may further include a hole conductor layer 18. As discussed below, hole conductor layer 18 may be a p-type conducting electrode layer. In some instances, hole conductor layer 18 may represent an electrolyte solution that is in contact with quantum dot layer 12 such that the electrolyte solution can reduce, i.e., replace electrons, within quantum dot layer 12 when incident photons cause individual quantum dots within quantum dot layer 12 to eject electrons through bridge layer 14 and into electron conductor layer 16. Quantum dot layer 12 may include one quantum dot or a plurality of quantum dots. Quantum dots are typically very small semiconductors, having dimensions in the nanometer range. Because of their small size, quantum dots may exhibit quantum behavior that is distinct from what would otherwise be expected from a larger sample of the material. In some cases, quantum dots may be considered as being crystals composed of materials from Groups II-VI, III-V, or IV-VI materials. The quantum dots employed herein may be formed using any appropriate technique. Examples of specific pairs of materials for forming quantum dots include, but are not limited to, MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $Tn_2O_3$, $Tn_2S_3$, $Tn_2Se_3$, $Tn_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs and InSb. Additional examples of quantum dot materials include $CuInSe_2$, $CuS_2$, $AgS_2$, CdSe/ZnS core/shell structure, CdSe/ZnSe core/shell structure and others.

Figure 2:
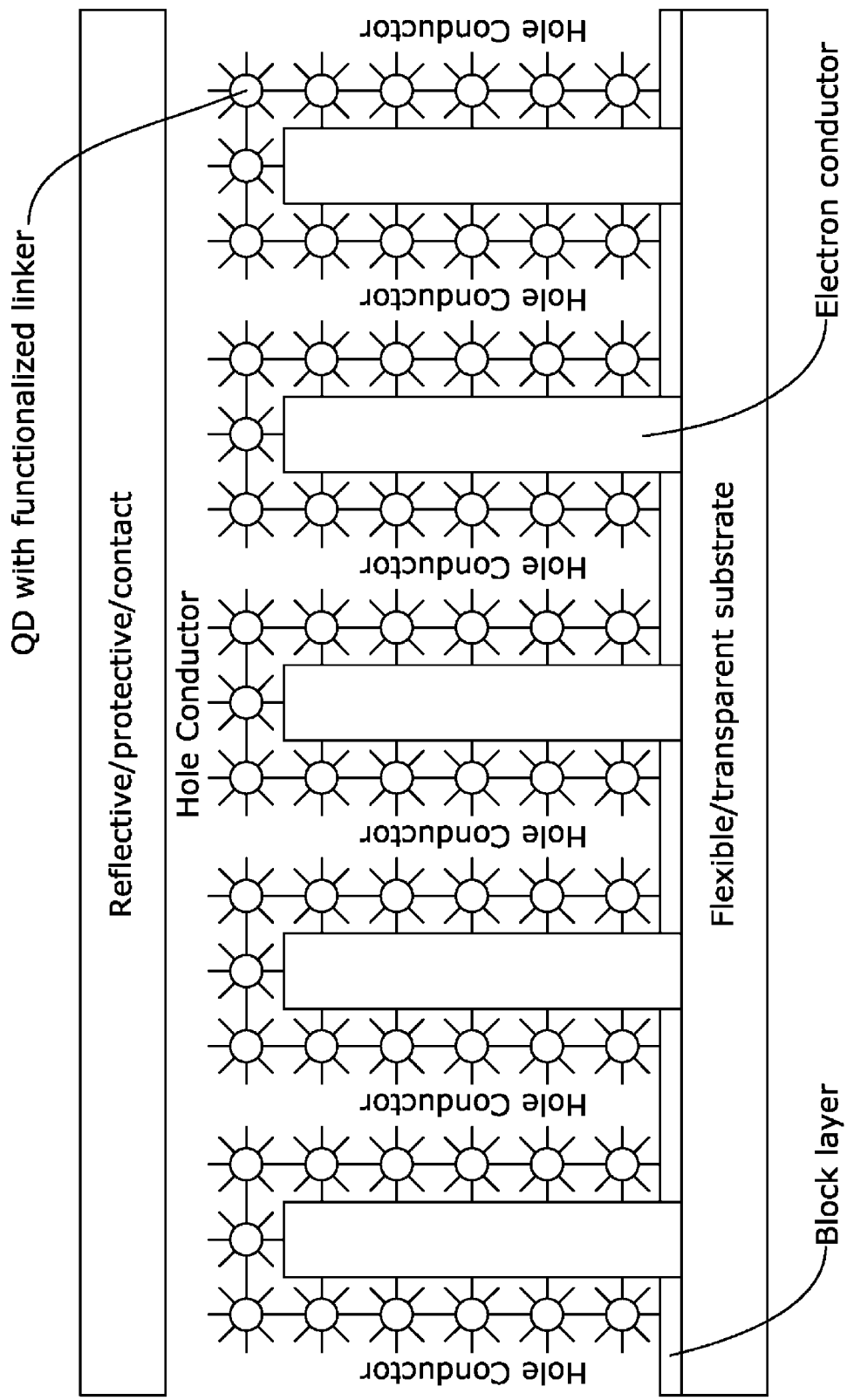
FIG. 2 is a schematic cross-sectional side view of another illustrative but non-limiting example of a solar cell.

FIG. 2 is a schematic cross-sectional side view of an illustrative solar cell that is similar to solar cell 10 (FIG. 1). In some cases, a reflective and/or protecting layer may be disposed over the hole conductor layer, as shown. The reflective and/or protecting layer may be a conductive layer. In some instances, the reflective and/or protecting layer may include a Pt/Au/C film as both catalyst and conductor, but this is not required. Alternatively, or in addition, a flexible and transparent substrate, shown at the lower side (in the illustrated orientation) of FIG. 2, may be an electron conductor such as an n-type electron conductor. The n-type electron conductor may be transparent or at least substantially transparent to at least some wavelengths of light within the visible portion of the electromagnetic spectrum.

As described with respect to FIG. 1, solar cell 10 may include a bridge layer 14. Bridge layer 14 may include a single conjugated bridge molecule or a large number of conjugated bridge molecules. A conjugated bridge molecule may, in some cases, be considered as improving electron transfer by reducing the energy barriers for electron transfer. Conjugated bridge molecules may also be rigid and thus may, in some cases, improve the alignment of the quantum dots stereochemically. In some instances, a conjugated bridge molecule may serve one or more purposes or functions. A conjugated bridge molecule may provide a conduit so that electrons that are ejected by the quantum dot can travel to the electron conductor. A conjugated bridge molecule may, for example, secure the quantum dot relative to the electron conductor and/or any other related structure.

The conjugated bridge molecule may be considered as including several segments or portions. These segments or portions include a quantum dot anchor that may be considered as bonding to the quantum dot, an electron conductor anchor that may be considered as bonding to the electron conductor and a conjugated bridge or linker portion to which the quantum dot anchor and the electron conductor anchor are bonded or otherwise secured. Each of these segments or portions will be discussed, in turn.

The quantum dot anchor, which may be bonded to the conjugated bridge portion or otherwise be formed as a portion thereof, may be a molecular group or moiety that has an affinity for bonding to quantum dots. In some cases, the quantum dot anchor may include a thiol moiety or an amine moiety.

The electron conductor anchor, which may be bonded to the conjugated bridge portion or otherwise be formed as a portion thereof, may be a molecular group or moiety that has an affinity for bonding to electron conductors. In some cases, the electron conductor anchor may include a carboxylic acid moiety or a phosphonic acid moiety.

In some instances, the quantum dot anchor may include a first quantum dot anchor group and a second quantum dot anchor group that are bonded or otherwise disposed on the conjugated bridge molecule such that the first quantum dot anchor group and the second quantum dot anchor group form a ring structure in combination with the conjugated bridge molecule and a bonding site on the quantum dot. Each of the first quantum dot anchor group and the second quantum anchor groups can be moieties that have an affinity for bonding to quantum dots.

In some instances, the electron conductor anchor may include a first electron conductor anchor group and a second electron conductor anchor group that are bonded or otherwise disposed on the conjugated bridge molecule such that the first electron conductor anchor group and the second electron conductor anchor group form a ring structure in combination with the conjugated bridge molecule and a bonding site on the electron conductor. Each of the first electron conductor anchor group and the second electron conductor groups can be moieties that have an affinity for bonding to electron conductors.

In some cases, and as noted above, a conjugated bridge molecule may be functionalized to include two anchors that, for example, can bond to a single quantum dot, or perhaps to a single attachment point along an electron conductor. To illustrate, the following structure may be considered as generically representing a conjugated molecule, which can be cyclic or acyclic, that includes adjacent functional groups $R_1$ and $R_2$:

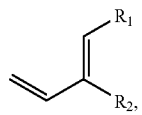

where $R_1$ and $R_2$ are anchor groups that may be independently selected from:

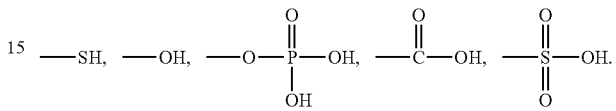

It will be appreciated that $R_1$ and $R_2$ may, in conjunction with a portion of the conjugated molecule and a binding site on either a quantum dot or an electron conductor, form a five member ring. This can be seen below:

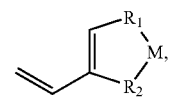

where $R_1$ and $R_2$ are defined as above and M represents a binding site present either within a quantum dot or an electron conductor. Examples of binding sites include Ti, Cr, Cd, Cu and similar elements.

An illustrative but non-limiting example of a conjugated bridge molecule that may form a five membered ring with a binding site within an electron conductor is catechol, which as shown below, includes a diol functionality, i.e., hydroxyl groups on adjacent ring carbons. Catechol, methyl catechol and t-butyl catechol, which can each be functionalized to include one or more quantum dot anchors, have the following structures, respectively:

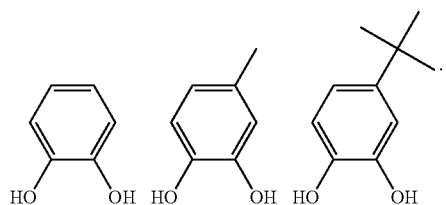

Another suitable conjugated bridge molecule includes 4,5-disulfanylanthracene-1,8-dicarboxylic acid. In some cases, this molecule may secure two quantum dots and may bond to adjacent or nearby binding sites on an electron conductor. In some cases, it is contemplated that this molecule, by virtue of having two adjacent groups that may bond to a quantum dot as well as two adjacent groups that may bond to an electron conductor, may form five member rings with a quantum dot and an electron conductor binding site, respectively. 4,5-disulfanylanthracene-1,8-dicarboxylic acid has the following structure:

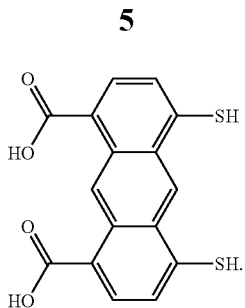

Another suitable conjugated bridge molecule includes alizarin, which has a diol functionality that can form a five member ring with an electron conductor. Alizarin, which can be functionalized to include one or more quantum dot anchors, has the following structure:

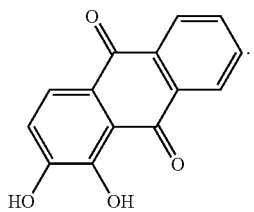

Another suitable conjugated bridge molecule is 3,4-dihydroxybenzylamine, which includes a diol functionality that can form a five member ring with an electron conductor binding site as well as an amine moiety that can bind with a quantum dot. This molecule has the following structure:

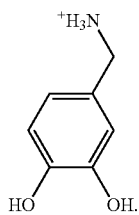

Another suitable conjugated bridge molecule is dopamine, which includes a diol functionality that can form a five member ring with an electron conductor binding site as well as an amine moiety that can bind with a quantum dot. This molecule has the following structure:

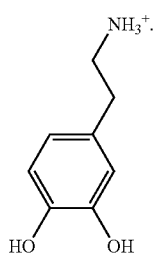

In some instances, as shown below, two dopamine molecules can form a complex and bind to a quantum dot through a sulfur atom:

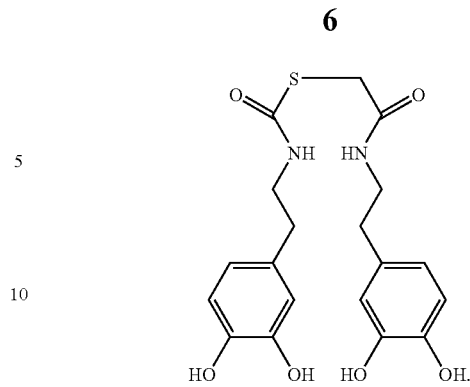

Another suitable conjugated bridge molecule is ascorbic acid, which has the following structure:

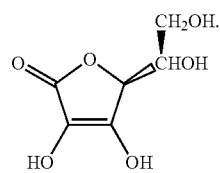

Another suitable conjugated bridge molecule is dihydroxy cyclobutendione, which has the following structure:

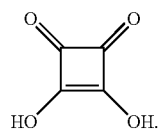

In some cases, a conjugated bridge molecule may have adjacent anchor groups that can form a six member ring with bonding sites such as a titanium atom or a zinc atom present within a $TiO_2$ or ZnO electron conductor. In particular, and as shown below, an anchor group that has both a carboxyl moiety and an hydroxyl moiety can form six member rings:

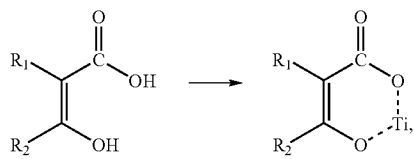

where $R_1$ and $R_2$ are used in this model to generically represent the rest of the conjugated anchor group. It will be recognized that the conjugated anchor can vibrate between three different forms, as shown below:

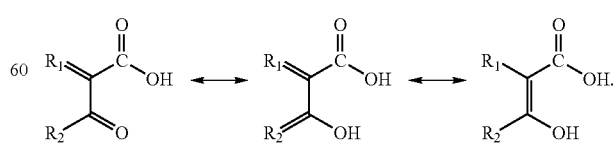

A variety of conjugated bridge molecules may form six member rings. Illustrative but non-limiting examples include 4-aminosalicylic acid and 5-mercaptosalicylic acid. As seen below, 4-aminosalicylic acid includes an amine moiety that can bind to a quantum dot and 5-mercaptosalicylic acid includes a thiol moiety that can bind to a quantum dot:

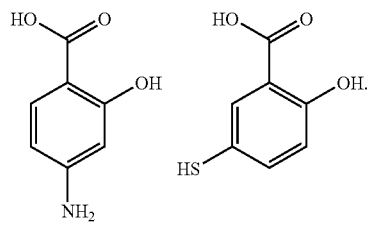

In some cases, a conjugated bridge molecule may not have paired functional groups that can form a five or six member ring with either a quantum dot or an electron conductor. In some instances, a conjugated bridge molecule may only have a single quantum dot anchor and a single electron conductor anchor. Examples of such molecules include 3-mercaptoacrylic acid and 2-mercapto-2-propenoic acid, the structures of which are shown below. It will be recognized that the anchor groups shown on these specific molecules are to be considered as illustrative only, as other anchor groups may be used:

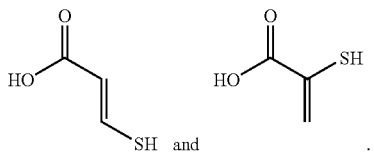

An illustrative but non-limiting example of a suitable conjugated molecule includes 4 mercaptobenzoic acid, which has the following structure:

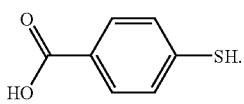

Another suitable conjugated bridge molecule includes 3-mercaptobenzoic acid, which has the following structure:

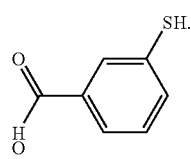

Another suitable conjugated bridge molecule includes isonicotinic acid, which has the following structure:

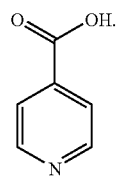

Another suitable conjugated bridge molecule includes 2-benzothiazolethiol, if functionalized to include an electron conductor anchor. This molecule has the following structure:

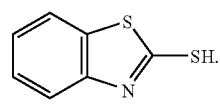

Another suitable conjugated bridge molecule includes mercaptosuccinic acid, which has the following structure:

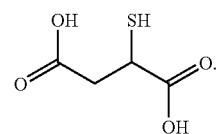

Another suitable conjugated bridge molecule includes 3-mercaptopyruvate, which has the following structure:

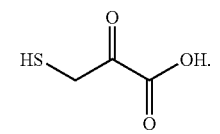

Another suitable conjugated bridge molecule comprises 4-methylmercapto-3-methylphenyl dimethyl thiophosphate, which has the following structure:

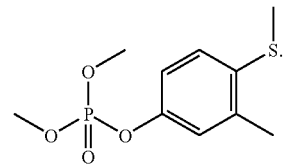

Another suitable conjugated bridge molecule includes diethyl S-(2-(ethylthio)ethyl)phosphorothiolate, which has the following structure:

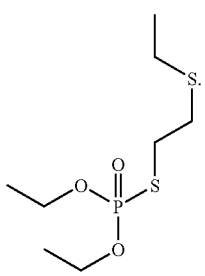

In some cases, a solar cell may include a conjugated bridge molecule having a first anchor group bonded to a quantum dot and a second anchor group bonded to an electron conductor. A solar cell may include a hole conductor that is configured to reduce the quantum dot once the quantum dot has absorbed a photon and ejected an electron through the conjugated bridge molecule to the electron conductor.

Referring back to FIG. 1, the illustrative solar cell 10 may include an electron conductor layer 16, which may be formed of any suitable material. In some instances, electron conductor layer 16 may be formed of a wide bandgap semiconductor. Illustrative but non-limiting examples include $TiO_2$, ZnO, $SnO_2$ and $ZnO/TiO_2$ core/shell structures. In some cases, electron conductor layer 16 may be an electrically conducting polymer such as a polymer that has been doped to be electrically conducting or to improve its electrical conductivity.

As discussed with respect to FIG. 1, solar cell 10 may include a hole conductor layer 18. A variety of hole conductors are contemplated. In some cases, for example, hole conductor layer 18 may be a p-type electrically conductive polymer. Any suitable p-type conductive polymer may be used, such as P3HT, or poly(3-hexyl thiophene), poly[3-(ω-mercapto hexyl)]thiophene, poly[3-(ω-mercapto undecyl)]thiophene, poly[3-(ω-mercapto dodecyl)]thiophene, MEH-PPV, or poly[2,5-dimethoxy-1,4-phenylene-1,2-ethenylene, 2-methoxy-5-2-ethylhexyloxy-1,4-phenylene-1,2-ethylene), PPP, or poly(p-phenylene), TFB, or poly(9,9-dioctylfluorene-co-N-(4-(3-methylpropyl)-diphenylamine), and the like.

In some cases, hole conductor layer 16 may be an electrolyte. An illustrative but non-limiting example of an electrolyte may be formed by dissolving suitable redox materials such as combinations of metal iodides with iodine or combinations of metal bromides with bromine. Examples of suitable metal iodides include LiI, NaI, KI, $CaI_2$ and $MgI_2$. Examples of suitable metal bromides include LiBr, NaBr, KBr and $CaBr_2$. Examples of suitable solvents include but are not limited to carbonate compounds and nitrile compounds.

In some instances, it is contemplated that the hole conductor may itself absorb light and produce excitons (electron-hole pairs). The electrons may be transferred to a conductive band of the quantum dots while the holes may be transferred to a counter electrode (anode). In these circumstances, the quantum dots have two functions. One function is to absorb photons and generate electrons and holes, as discussed above. A second function is to transfer the electrons that are generated within the hole conductor to a conductive band of the electron conductor.

An experiment was conducted to test the ability of 4-mercaptobenzoic acid (MBA) to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 0.1 ml of the CdSe solution (in hexane), 0.1 ml MBA solution (0.1 molar MBA in ethanol), 0.05 ml of titanium dioxide colloid and 0.9 ml of a 1:1 volumetric mixture of ethanol and tetrahydrofuran. The solution was allowed to react. The resultant product was centrifuged at 3000 rpm for a period of two minutes. After discarding the supernatant, the remaining pellet was tested.

Figure 3:
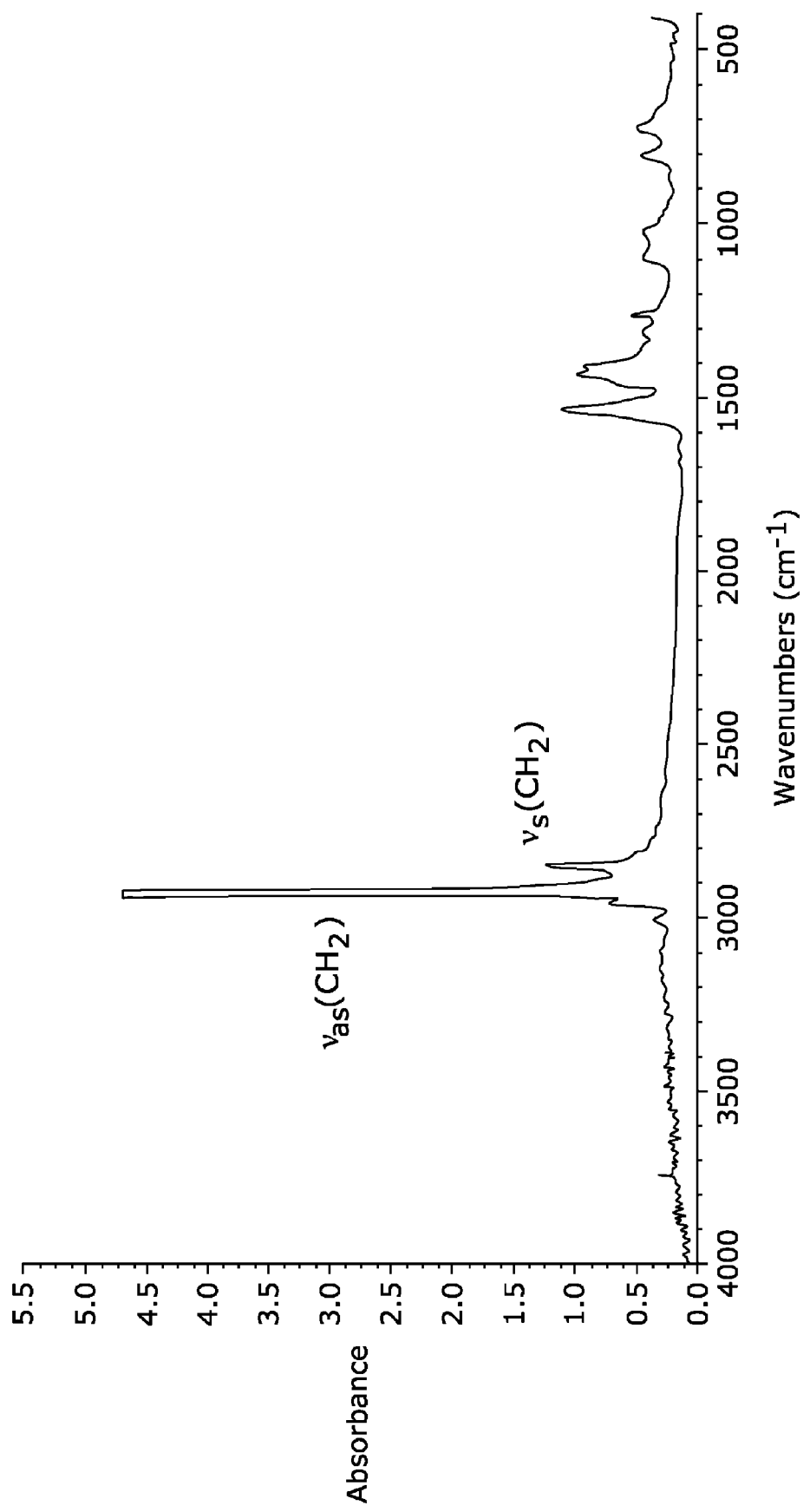
FIGS. 3 through 6 are graphical representation of certain experimental results.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 4:
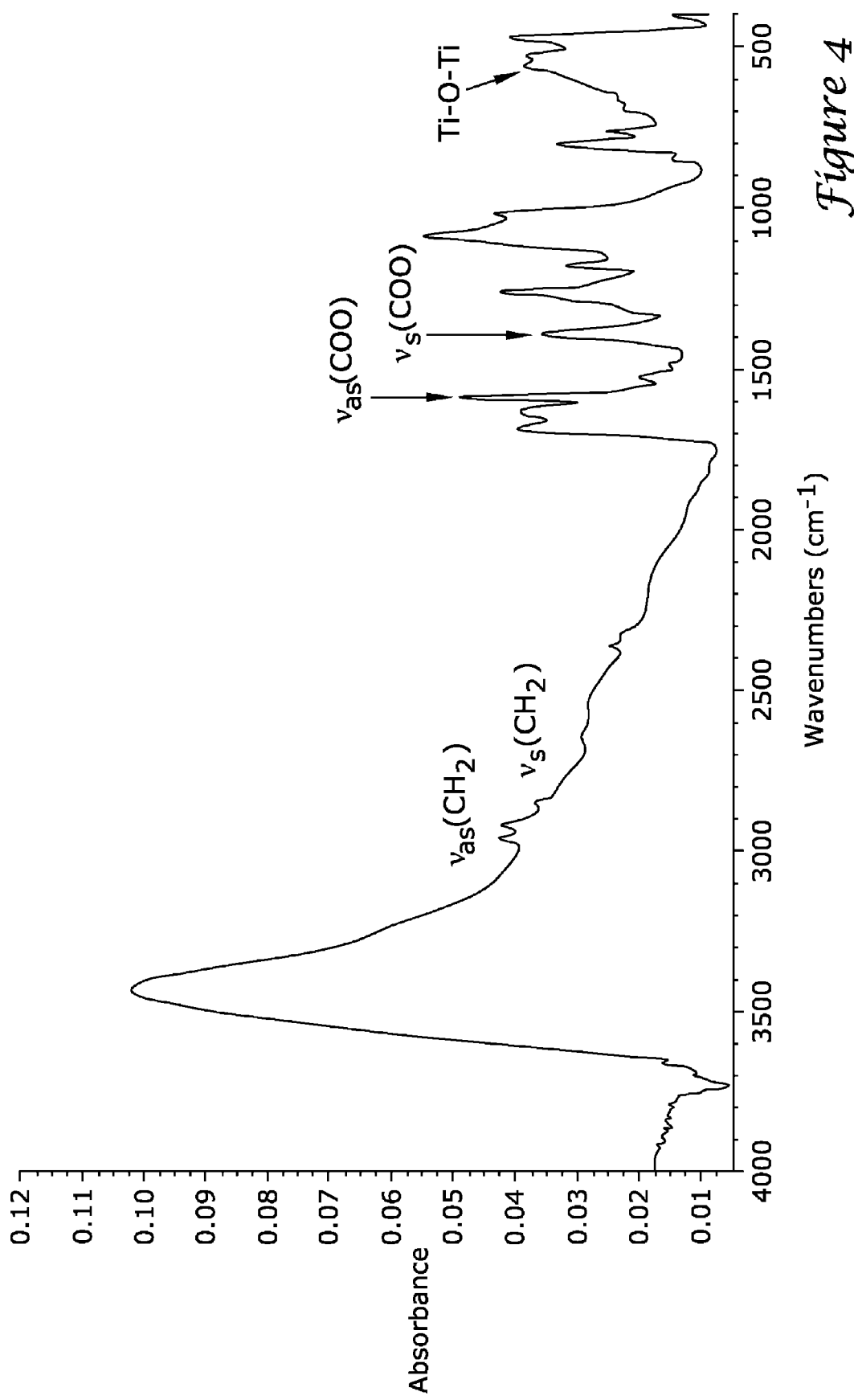

FIG. 4 provides the FTIR results pertaining to the pellet described above. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the MBA. Moreover, it can be seen that there are strong COO peaks as well as a Ti—O—Ti peak, indicating the presence of MBA on the $TiO_2$ surface.

An experiment was conducted to test the ability of dopamine to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 0.1 ml of the CdSe solution (in hexane), 1 ml dopamine solution (in ethanol) and 0.05 ml titanium dioxide colloid. The solution was allowed to react. The resultant product was centrifuged at 3000 rpm for a period of two minutes. After discarding the supernatant, the remaining pellet was tested.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 5:
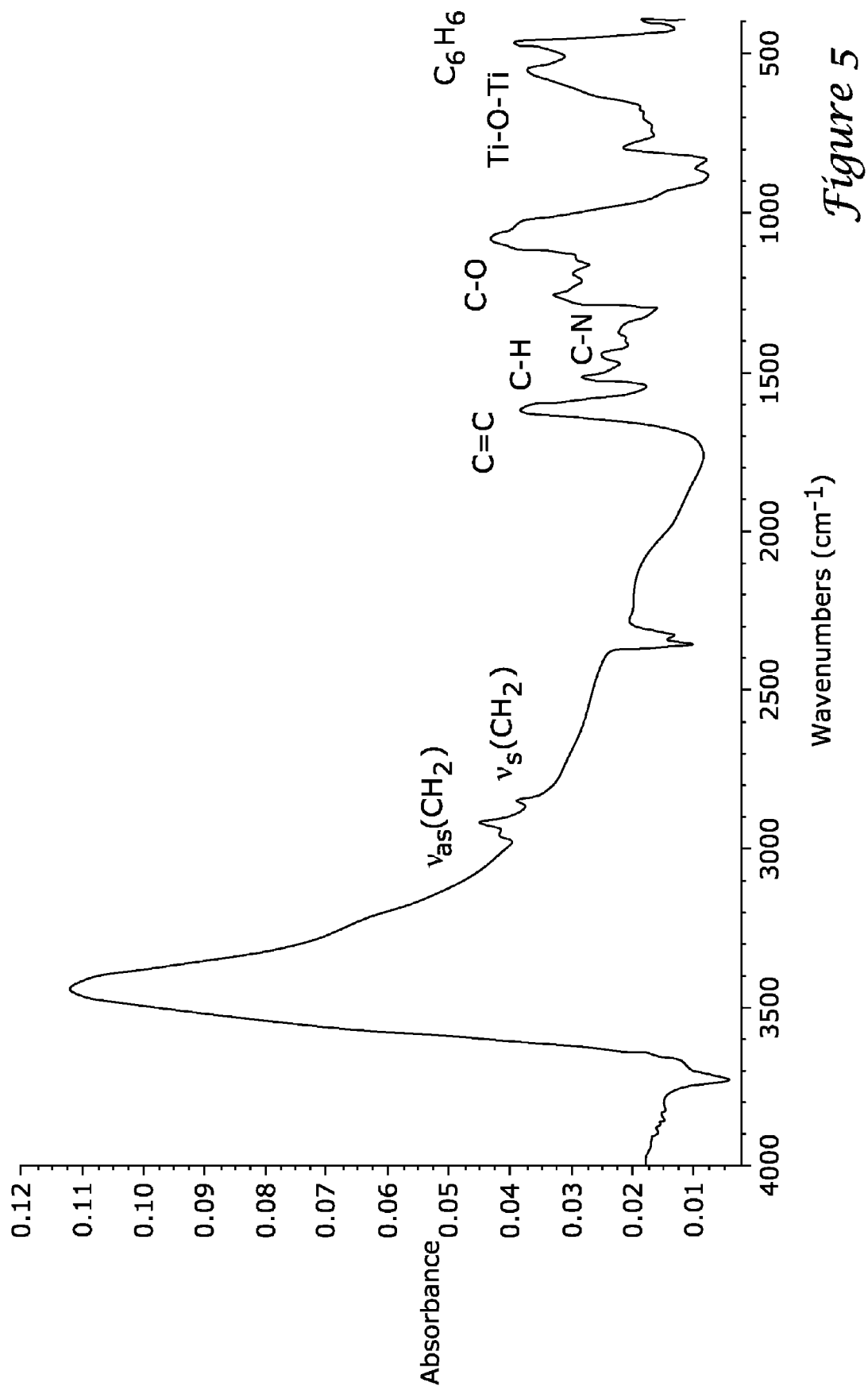

FIG. 5 provides the FTIR results pertaining to the pellet described above with respect to the dopamine linker. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the dopamine.

Moreover, there are now a number of peaks in the 500 $cm^{-1}$ to about 1650 $cm^{-1}$ range indicating the formation of a five membered ring. In particular, the five membered ring is formed between titanium, the oxygen atoms that were originally part of the two hydroxyl groups on the dopamine, and the two ring carbons to which the hydroxyl groups were bound.

An experiment was conducted to test the ability of 3,4-dihydroxybenzlamine to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 300 mg of 3,4-dihydroxybenzylamine hydrobromide with 10 ml of ethanol. A reaction solution was formed by combining 0.1 ml of the CdSe solution and 1 ml of the previously-formed dihydroxybenzylamine hydrobromide solution. The reaction solution was subjected to ultrasonic agitation for 5 minutes, and was then centrifuged at 3000 rpm for two minutes. After discarding the supernatant, the remaining pellet was tested.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 6:
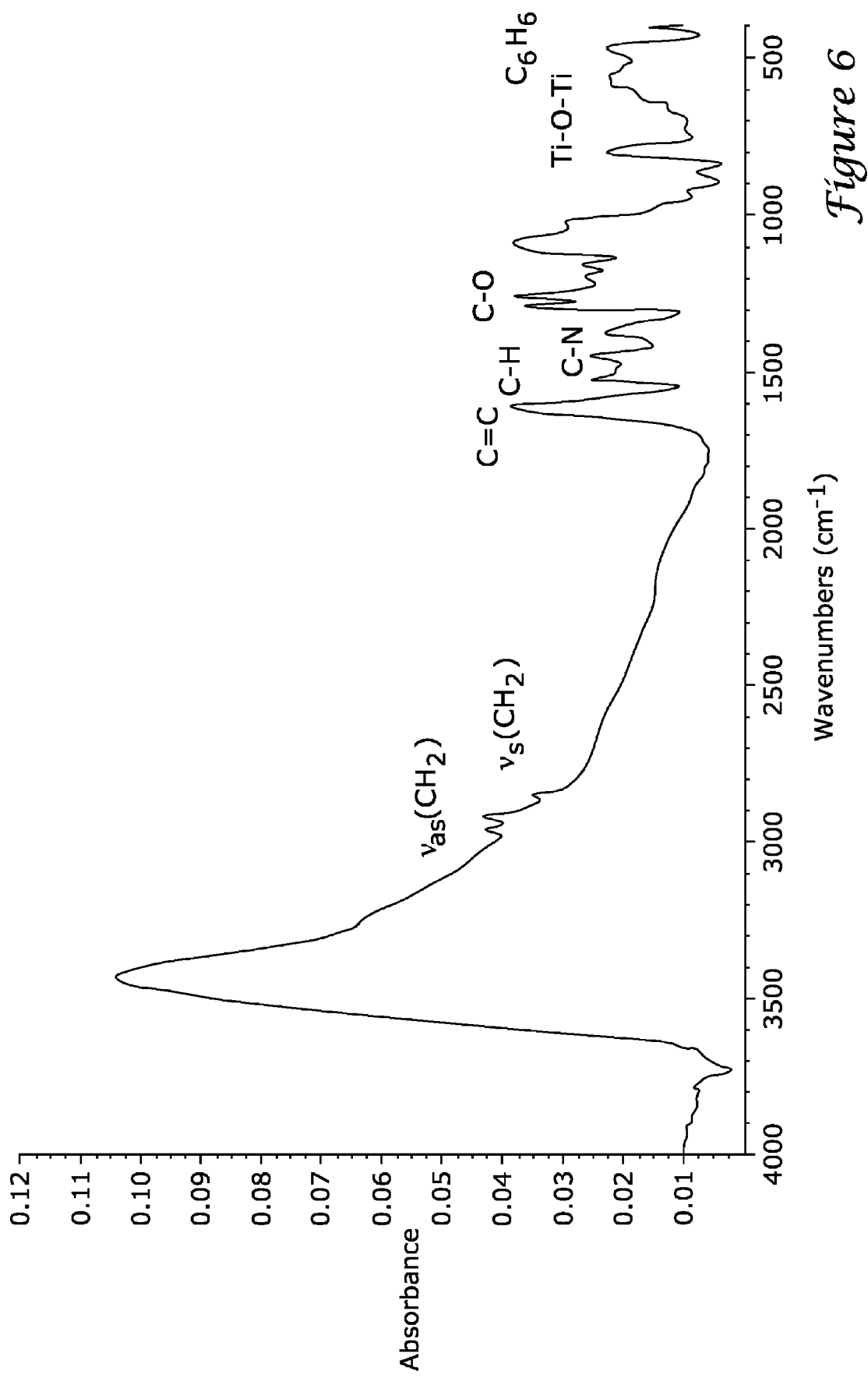

FIG. 6 provides the FTIR results pertaining to the pellet described above with respect to the 3,4-dihydroxybenzlamine linker. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the 3,4-dihydroxybenzlamine.

Moreover, there are now a number of peaks in the 500 $cm^{-1}$ to about 1650 $cm^{-1}$ range indicating the formation of a five membered ring. In particular, the five membered ring is formed between titanium, the oxygen atoms that were originally part of the two hydroxyl groups on the dopamine, and the two ring carbons to which the hydroxyl groups were bound.

The disclosure should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

We claim:

1. A light sensitive assembly, comprising:
   a quantum dot;
   an electron conductor;
   a conjugated bridge molecule disposed between the quantum dot and the electron conductor, the conjugated bridge molecule comprising a quantum dot anchor bonded to the quantum dot and an electron conductor anchor bonded to the electron conductor; and
   wherein the quantum dot anchor comprises a first quantum dot anchor group and a second quantum dot anchor group, the first quantum dot anchor group and the second quantum dot anchor group forming a ring structure in combination with the conjugated bridge molecule and a bonding site on the quantum dot.

2. The light sensitive assembly of claim 1, wherein each of the first quantum dot anchor group and the second quantum dot anchor group independently comprise a thiol moiety or an amine moiety.

3. The light sensitive assembly of claim 1, wherein the electron conductor anchor comprises a first electron conductor anchor group and a second electron conductor anchor group, the first electron conductor anchor group and the second electron conductor group forming a ring structure in combination with the conjugated bridge molecule and a bonding site on the electron conductor.

4. A solar cell comprising:
   a quantum dot layer comprising a plurality of quantum dots;
   an electron conductor layer;
   a conjugated bridge molecule layer disposed between the quantum dot layer and the electron conductor layer;
   the conjugated bridge molecule layer comprising a quantum dot anchor bonded to the quantum dot layer and an electron conductor anchor bonded to the electron conductor layer;
   wherein the quantum dot anchor comprises a first quantum dot anchor group and a second quantum dot anchor group, the first quantum dot anchor group and the second quantum dot anchor group forming a ring structure in combination with the conjugated bridge molecule layer and a bonding site on the quantum dot layer; and
   a hole conductor layer in contact with the quantum dot layer.

5. The solar cell of claim 4, wherein the electron conductor layer comprises an n-type semiconductor.

6. The solar cell of claim 4, wherein the hole conductor comprises a conductive polymer.

7. The solar cell of claim 4, wherein the hole conductor layer comprises an electrolyte.

8. The solar cell of claim 4, wherein the hole conductor layer comprises a p-type conductor.

9. The solar cell of claim 4, wherein the conjugated bridge molecule layer comprises a plurality of conjugated bridge molecules, and wherein at least some of the plurality of conjugated bridge molecules include one or more of

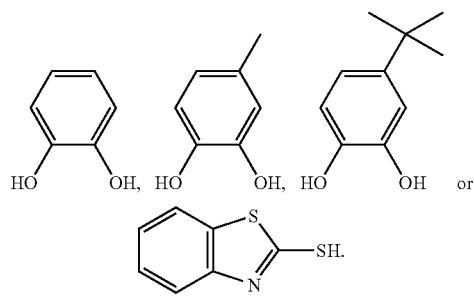

10. The solar cell of claim 4, wherein the conjugated bridge molecule layer comprises a plurality of conjugated bridge molecules, and wherein at least some of the plurality of conjugated bridge molecules are selected from the group consisting of

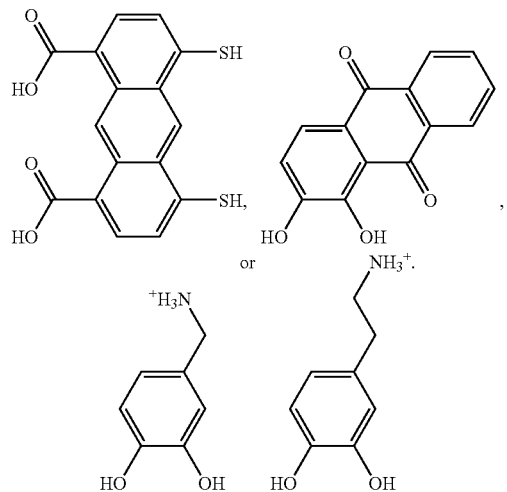

11. The solar cell of claim 4, wherein the conjugated bridge molecule layer comprises a plurality of conjugated bridge molecules, and wherein at least some of the plurality of conjugated bridge molecules are selected from the group consisting of

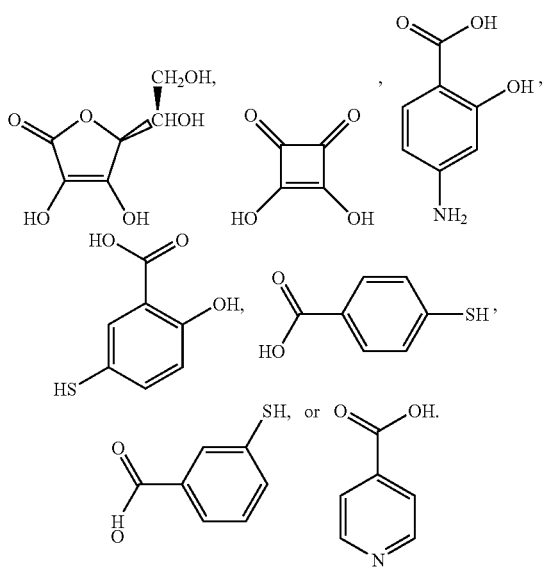

12. The solar cell of claim 4, wherein the conjugated bridge molecule layer comprises a plurality of conjugated bridge molecules, and wherein at least some of the plurality of conjugated bridge molecules comprises

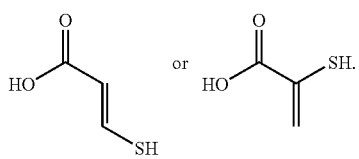

13. A solar cell comprising:
a quantum dot;
an electron conductor;
a conjugated bridge molecule disposed between the quantum dot and the electron conductor, the conjugated bridge molecule comprising a first anchor group bonded to the quantum dot and a second anchor group bonded to the electron conductor;
a hole conductor configured to reduce the quantum dot once the quantum dot absorbs a photon and ejects an electron through the conjugated bridge molecule and into the electron conductor; and
wherein the conjugated bridge molecule is selected from the group consisting of

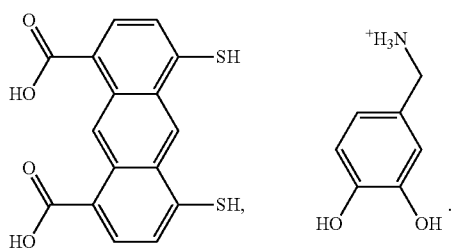

14. A solar cell comprising:
a quantum dot;
an electron conductor;
a conjugated bridge molecule disposed between the quantum dot and the electron conductor, the conjugated bridge molecule comprising a first anchor group bonded to the quantum dot and a second anchor group bonded to the electron conductor;
a hole conductor configured to reduce the quantum dot once the quantum dot absorbs a photon and ejects an electron through the conjugated bridge molecule and into the electron conductor; and
wherein the conjugated bridge molecule is selected from the group consisting of

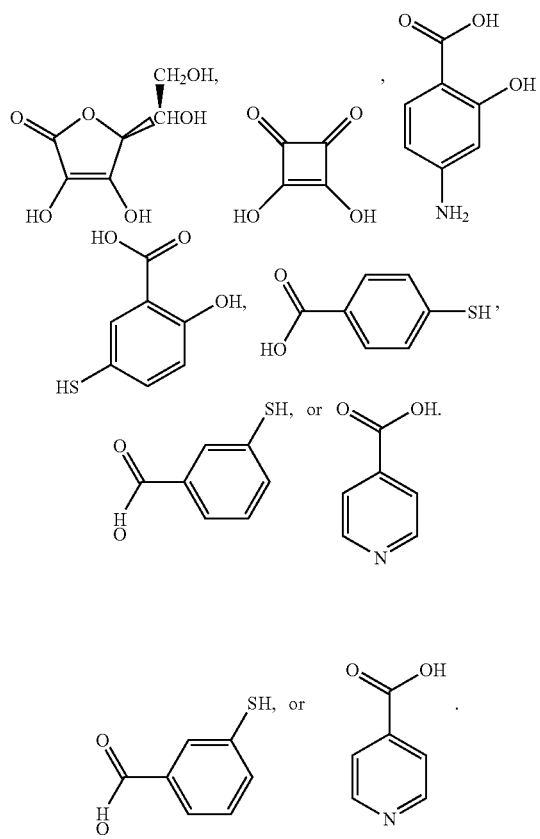

15. A light sensitive assembly, comprising:
a quantum dot;
an electron conductor;
a conjugated bridge molecule disposed between the quantum dot and the electron conductor, the conjugated bridge molecule comprising a quantum dot anchor bonded to the quantum dot and an electron conductor anchor bonded to the electron conductor;
wherein the electron conductor anchor comprises a first electron conductor anchor group and a second electron conductor anchor group, the first electron conductor anchor group and the second electron conductor group forming a ring structure in combination with the conjugated bridge molecule and a bonding site on the electron conductor; and
wherein each of the first electron conductor anchor group and the second electron conductor anchor group independently comprise a carboxylic acid moiety or a phosphonic acid moiety.

* * * * *